(12) United States Patent
Nishijima et al.

(10) Patent No.: US 9,431,571 B2
(45) Date of Patent: Aug. 30, 2016

(54) METHOD OF MANUFACTURING THIN-FILM PHOTOVOLTAIC MODULE

(71) Applicants: SOLAR FRONTIER K.K., Tokyo (JP); HITACHI ZOSEN CORPORATION, Osaka (JP)

(72) Inventors: Yoshiya Nishijima, Tokyo (JP); Tetsuo Miyano, Tokyo (JP); Hideo Tanaka, Tokyo (JP); Ichiro Sakai, Osaka (JP); Takuto Yamashita, Osaka (JP); Hiroki Yamada, Osaka (JP); Shigeaki Nakayama, Osaka (JP)

(73) Assignees: SOLAR FRONTIER K.K., Tokyo (JP); HITACHI ZOSEN CORPORATION, Osaka (JP)

( * ) Notice: Subject to any disclaimer, the term of this patent is extended or adjusted under 35 U.S.C. 154(b) by 0 days.

(21) Appl. No.: 14/416,108

(22) PCT Filed: Jul. 4, 2013

(86) PCT No.: PCT/JP2013/068367
§ 371 (c)(1),
(2) Date: Jan. 21, 2015

(87) PCT Pub. No.: WO2014/017270
PCT Pub. Date: Jan. 30, 2014

(65) Prior Publication Data
US 2015/0179871 A1    Jun. 25, 2015

(30) Foreign Application Priority Data

Jul. 25, 2012 (JP) ................................ 2012-164363

(51) Int. Cl.
*H01L 21/00* (2006.01)
*H01L 31/18* (2006.01)
(Continued)

(52) U.S. Cl.
CPC ......... *H01L 31/1896* (2013.01); *H01L 31/046* (2014.12); *H01L 31/048* (2013.01); *H01L 31/18* (2013.01); *Y02E 10/541* (2013.01); *Y02P 70/521* (2015.11)

(58) Field of Classification Search
None
See application file for complete search history.

(56) References Cited

U.S. PATENT DOCUMENTS 8,071,420 B2    12/2011  Su et al.
2010/0132759 A1*  6/2010  Jia .................. H01L 31/0463
                                                          136/244

(Continued)

FOREIGN PATENT DOCUMENTS

JP    2001-015786    1/2001
JP    2002-016269    1/2002

(Continued)

OTHER PUBLICATIONS

International Search Report mailed on Sep. 10, 2013.

*Primary Examiner* — Benjamin Sandvik
*Assistant Examiner* — Herve Assouman
(74) *Attorney, Agent, or Firm* — IPUSA, PLLC (57) ABSTRACT

A method of manufacturing a thin-film photovoltaic module in which a photoelectric conversion element is deposited on a substrate, includes removing the photoelectric conversion element at a frame shape area from sides of the substrate toward inside with a predetermined width by a first removing step of scanning a first photoelectric conversion element removing device at the area along the sides of the substrate to remove the photoelectric conversion element for the predetermined width, and a second removing step of scanning a second photoelectric conversion element removing device within the area along the sides of the substrate to remove the photoelectric conversion element that is not removed in the first removing step at a width narrower than the predetermined width and without superimposing a center line of a scanning path on a center line of a scanning path of the first photoelectric conversion element removing device.

11 Claims, 9 Drawing Sheets

(51) Int. Cl.
H01L 31/048 (2014.01)
H01L 31/046 (2014.01)

(56) References Cited

U.S. PATENT DOCUMENTS

2011/0114161 A1* 5/2011 Uchida ............... H01L 31/0392
  136/252
2011/0265848 A1* 11/2011 Ahn ..................... H01L 31/076
  136/244
2012/0184063 A1* 7/2012 Chung ................. H01L 31/068
  438/72

FOREIGN PATENT DOCUMENTS

| JP | 2008-066453 | 3/2008 |
| JP | 2011-067823 | 4/2011 |
| JP | 2011-181826 | 9/2011 |

* cited by examiner

METHOD OF MANUFACTURING THIN-FILM PHOTOVOLTAIC MODULE

BACKGROUND OF THE INVENTION

1. Field of the Invention

The present invention relates to a method of manufacturing a thin-film photovoltaic module and more specifically, to a technique for ensuring insulation properties of sides of a substrate on which a photoelectric conversion element is deposited.

2. Description of the Related Art

A thin-film photovoltaic module has a structure in which a photoelectric conversion element having a stacked structure of a first electrode layer, a thin-film photoelectric conversion layer and a second electrode layer in this order is deposited on a substrate and the substrate is sealed by a cover glass, a filling material, an edge seal or the like. It is necessary for the thin-film photovoltaic module to satisfy conditions of a standardized distance through insulation and a dielectric strength because it is necessary to ensure an electrical safety due to characteristics of a photovoltaic that generates an electromotive force by photoelectric conversion.

The distance through insulation is for ensuring a predetermined distance between a conductive portion of a module (in this invention, a photoelectric conversion element corresponds to this), and a metal portion (a frame of a photovoltaic module, in this invention, a module end portion corresponds to this) to which a human may touch. The distance through insulation is defined in IEC (International Electrotechnical Commission): 61730 (photovoltaic module safety qualification) or in "Photovoltaic (PV) module safety qualification" of JIS (Japanese Industrial Standards): C8992.

Further, the dielectric strength is for ensuring insulation properties between the conductive portion of the module (in this invention, the photoelectric conversion element corresponds to this), and the frame of the photovoltaic module (in this invention, the module end portion corresponds to this). The dielectric strength is defined in IEC: 61646 (Thin-film terrestrial photovoltaic (PV) modules—Design qualification and type approval) or JIS: C8991 (Thin-film terrestrial photovoltaic (PV) modules-Design qualification and type approval). According to the standard for the distance through insulation, the distance through insulation between the photoelectric conversion portion and the module end portion can be automatically determined from a system voltage. Thus, at a first glance, the distance through insulation, in other words, a width of a peripheral removed area, which will be explained later, is considered as an item that can be capable of being solved by just appropriately designing a module. However, the dielectric strength largely depends on its surface condition and in order to satisfy a predetermined standard, generally, a distance larger than the above described distance through insulation is necessary. This means that in determining the width of the peripheral removed area that satisfies both of the conditions of the distance through insulation and the dielectric strength, it is necessary to consider the above explained matters as well as considering the following scheme.

The photoelectric conversion element is deposited on the entire surface of a substrate in its manufacturing step. Then, in order to satisfy the above described conditions of the distance through insulation and the dielectric strength, the photoelectric conversion element at a peripheral portion of the substrate is removed (deleted). Specifically, in order to satisfy the condition of the standardized distance through insulation, it is necessary to remove the photoelectric conversion element at the peripheral portion on the substrate with a width greater than or equal to the distance defined as a standard value. Further, in order to provide a dielectric strength greater than or equal to a standard value, it is necessary to make the portion where the photoelectric conversion element is removed a clean surface, without remaining of the photoelectric conversion element.

Such a removal of the photoelectric conversion element at the peripheral portion of the substrate is referred to as removal of peripheral or edge deletion (or simply removal, deletion) as well, and there are various methods such as a method by sandblasting or a belt sander, a method by irradiating a laser beam or the like. In particular, recently, the method of removing by the laser beam, which has a good cost performance, is often used for a thin-film photovoltaic that is becoming to be larger and larger. A technique of removing a photoelectric conversion element at a peripheral portion of a thin-film photovoltaic panel by laser is provided in Patent Documents 1 and 2.

PATENT DOCUMENTS

Patent Document 1: Japanese Laid-open Patent Publication No. 2011-67823
Patent Document 2: U.S. Pat. No. 8,071,420

When removing the photoelectric conversion element formed on the substrate by the above described methods such as by sandblasting or the belt sander, the removing method by laser or the like, it is preferable that the photoelectric conversion element is completely removed from the portion to which the removing method is performed. However, actually, as there is a limitation such as a tact time or the like in the manufacturing step, an amount of remaining (hereinafter, referred to as "residue" as well) of the photoelectric conversion element within a range that does not influence on the dielectric strength is allowed.

On the other hand, if there is a variation in the actual removing condition due to some influences, there is a possibility that the remaining of removal increases and the dielectric strength is lowered. For example, according to the removing method by laser, by irradiating a laser beam with a high energy to an object to be removed, the object to be removed is instantly heated and vaporized to be directly removed, or a lower layer of the object is blown off by the pressure generated when being instantly heated and vaporized to be indirectly removed. At all cases, at portions to which the laser beam is not irradiated or at which the exposure energy is low, the object to be removed or the lower layer are remained on the substrate as the residue. Further, the residue may be generated due to a reason that the thickness of the photoelectric conversion element formed on the substrate is not necessarily uniform, dirt is adhered to an irradiation surface of the laser beam or the like.

Further, the laser beam is intermittently irradiated as a circular shaped pulse beam on the substrate. At this time, the object is removed by shifting the position of the laser beam such that the adjacent beams overlap with each other a little. However, the residue is generated at a portion to which the beam is not irradiated. The generation of the residue at the portions to which the beam is not irradiated may be prevented to a certain extent by making the beam diameter larger by adjusting the aperture diameter, by enlarging the overlapping amount of the continuous beams by increasing the frequency of the beam, by irradiating the laser beam at the same place or the like. However, there is a problem that a tact time increases in all cases.

SUMMARY OF THE INVENTION

The present invention is made in light of the above problems, and provides a technique capable of ensuring a necessary distance through insulation and a dielectric strength while suppressing increase of a tact time, in removing a photoelectric conversion element that is deposited at a peripheral portion of a substrate of a thin-film photovoltaic module.

According to an embodiment, there is provided a method of manufacturing a thin-film photovoltaic module in which a photoelectric conversion element is deposited on a substrate and insulation properties of a peripheral portion of the substrate is ensured, the photoelectric conversion element including a first electrode layer, a thin-film photoelectric conversion layer and a second electrode layer stacked in this order. The method includes removing the photoelectric conversion element at a frame shape area from sides of the substrate toward inside with a predetermined width, the photoelectric conversion element being deposited on the entirety of the substrate, by a first removing step of scanning a first photoelectric conversion element removing device at the area from the sides of the substrate toward inside with the predetermined width along the sides of the substrate to remove the photoelectric conversion element deposited on the substrate for the predetermined width, and a second removing step of scanning a second photoelectric conversion element removing device, within the area at which the photoelectric conversion element is removed in the first removing step, along the sides of the substrate to remove the photoelectric conversion element that is not removed in the first removing step at a width narrower than the predetermined width and without superimposing a center line of a scanning path on a center line of a scanning path of the first photoelectric conversion element removing device in the first removing step.

Here, the photoelectric conversion element removing device is a device to remove the photoelectric conversion element deposited on the substrate, and is actualized by a laser processing apparatus that irradiates a laser beam, sandblasting using an abrasive material, a belt sander or the like. Further, for the processing by the laser beam, for example, the scanning of the first photoelectric conversion element removing device and the second photoelectric conversion element removing device includes controlling a reflection angle of a mirror such as a galvanometer mirror or the like that reflects the laser beam in addition to moving the device such as a laser head or the like itself.

Further, the area from the sides of the substrate toward inside with the predetermined width may be divided into a plurality of unit areas by a constant length along the sides of the substrate, and the first removing step and the second removing step may be performed for each of the unit areas so that the photoelectric conversion element of a frame shape is removed by performing the first removing step and the second removing step for all of the plurality of unit areas.

Further, in the first removing step, the first photoelectric conversion element removing device may be scanned along a side of the substrate from one end to the another end of the substrate to remove the photoelectric conversion element deposited at the one end to the other end of the substrate, and the first photoelectric conversion element removing device may be moved in a direction perpendicular to the side of the substrate every time the photoelectric conversion element is removed from the one end to the other end of the substrate to remove the photoelectric conversion element from the side of the substrate for the predetermined width.

Further, the second photoelectric conversion element removing device in the second removing step may be a laser processing apparatus that irradiates a laser beam and the photoelectric conversion element is removed by the laser beam.

Further, the first photoelectric conversion element removing device in the first removing step may be a laser processing apparatus that irradiates a laser beam and the photoelectric conversion element is removed by the laser beam.

Further, an overlapping amount of the laser beam in a scanning direction of the first photoelectric conversion element removing device of the first removing step and an overlapping amount of the laser beam in a scanning direction of the second photoelectric conversion element removing device of the second removing step may be different from each other.

Further, the overlapping amount of the laser beam in the scanning direction of the second photoelectric conversion element removing device of the second removing step may be larger than the overlapping amount of the laser beam in the scanning direction of the first photoelectric conversion element removing device of the first removing step.

Further, in the second removing step, the second photoelectric conversion element removing device may be scanned in a lattice shape with respect to the entirety of the substrate.

Further, in the second removing step, the photoelectric conversion element may be removed with an upper surface portion of the substrate on which the photoelectric conversion element is deposited by the second photoelectric conversion element removing device.

Further, the width to which the second removing step is performed may be at least larger than or equal to a width of each of wirings that are attached to the first electrode layer and second electrode layer, respectively, for extracting current by photoelectric conversion, and the wirings are provided at the area where the second removing step may be performed on the substrate.

According to the embodiment, it is possible to ensure a necessary distance through insulation and a dielectric strength while suppressing increase of a tact time to the minimum, in removing a photoelectric conversion element that is deposited at a peripheral portion of a substrate of a thin-film photovoltaic module.

BRIEF DESCRIPTION OF THE DRAWINGS

FIG. 3-(a) is a plan view illustrating the peripheral removed area formed by a first removing step, and FIG. 3-(b) is a plan view illustrating the peripheral removed area formed by a second removing step, in the method of manufacturing the thin-film photovoltaic module of the embodiment;

FIG. 7-(*a*) is a cross-sectional view when the first removing step is performed, and FIG. 7-(*b*) is a cross-sectional view when the second removing step is performed, in the method of manufacturing the thin-film photovoltaic module of the embodiment;

FIG. 11-(*a*) is a plan view and FIG. 11-(*b*) is a cross-sectional view, illustrating the thin-film photovoltaic module manufactured by the method of manufacturing the thin-film photovoltaic module of a fourth embodiment;

FIG. 12-(*a*) is a cross-sectional view when the first removing step is performed, and FIG. 12-(*b*) is a cross-sectional view when the second removing step is performed, in the method of manufacturing the thin-film photovoltaic module of the embodiment;

FIG. 14-(*a*) is a plan view illustrating a state in which third and fourth removing steps are performed for a single unit area, and FIG. 14-(*b*) is a plan view illustrating a state in which the third and fourth removing steps are performed for a next single unit area, in the method of manufacturing the thin-film photovoltaic module of the embodiment.

DETAILED DESCRIPTION OF THE PREFERRED EMBODIMENTS

Figure 1:
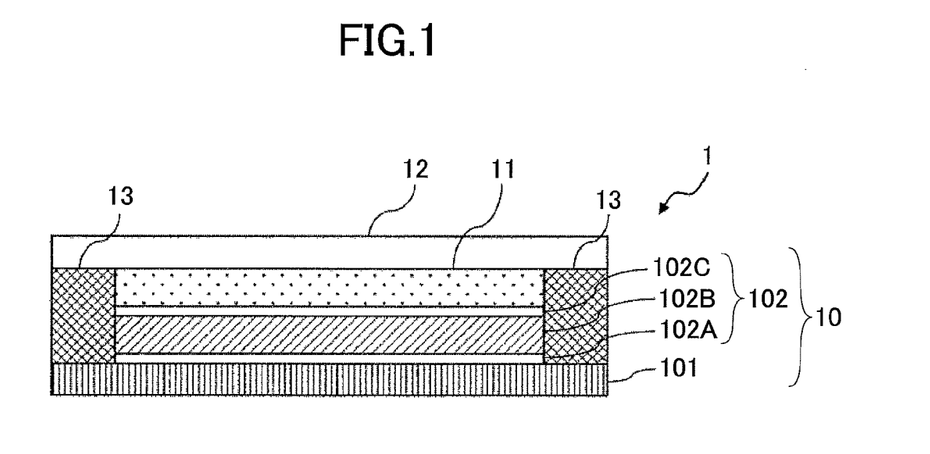
FIG. 1 is a schematic view illustrating a structure of a thin-film photovoltaic module manufactured by a method of manufacturing a thin-film photovoltaic module of an embodiment.

A method of manufacturing a thin-film photovoltaic module of an embodiment is explained with reference to drawings. FIG. 1 illustrates a stacked structure of a thin-film photovoltaic module 1 manufactured by a method of manufacturing a thin-film photovoltaic module of the embodiment. The thin-film photovoltaic module 1 includes a circuit board 10, a filling material 11, a cover glass 12, and a sealant 13. Here, for the thin-film photovoltaic module 1 as a product, a frame, a back sheet or the like may be appropriately attached for ensuring weather resistance and strength, in addition to the above described components. Further, a structure in which the filling material 11 covers the peripheral portion of the thin-film photovoltaic module 1 instead of the sealant 13 is within the scope of the invention.

The cover glass 12 is laminated on an upper surface of the circuit board 10 via the filling material 11 such as Ethylene-Vinyl Acetate (EVA) resin, Polyvinyl Butyral (PVB) or the like. Further, a peripheral portion of the circuit board 10 is sealed by the sealant 13 such as butyl rubber or the like.

The circuit board 10 has a stacked structure of a substrate 101 such as a glass substrate or the like and a photoelectric conversion element 102 on the substrate 101.

The photoelectric conversion element 102 has a substrate structure in which a first electrode layer 102A made of metal such as molybdenum (Mo) or the like, a thin-film photoelectric conversion layer 102B and a second electrode layer 102C made of a transparent conductive film (TCO: Transparent Conductive Oxide) are stacked in this order, where a second electrode layer 102C side is formed as a light receiving surface. Alternatively, the photoelectric conversion element 102 may have a superstrate structure in which the second electrode layer 102C made of the transparent conductive film (TCO: Transparent Conductive Oxide), the thin-film photoelectric conversion layer 102B and the first electrode layer 102A are stacked on a lower surface of the cover glass 12 in this order, where an upper surface side of the cover glass 12 is formed as a light receiving surface. However, in such a case, the photoelectric conversion element 102 deposited on the cover glass 12 is removed in removing the photoelectric conversion element 102.

The thin-film photoelectric conversion layer 102B converts irradiated sunlight or the like into electricity (photoelectric conversion), and an electromotive force generated at the thin-film photoelectric conversion layer 102B by the photoelectric conversion is drawn outside from the first electrode layer 102A and the second electrode layer 102C as current. For such the photoelectric conversion element 102, a thin-film photovoltaic device such as a compound-based thin-film photovoltaic device like a CIS-based thin-film photovoltaic device or the like, a silicon-based thin-film photovoltaic like an amorphous silicon-based thin-film photovoltaic device or the like, or the like may be used, for example, and all of them are within the scope of the invention.

The thin-film photovoltaic module 1 having the above described structure is manufactured by the following three manufacturing steps.

(First Manufacturing Step)

The photoelectric conversion element 102, that has a stacked structure of the first electrode layer 102A, the thin-film photoelectric conversion layer 102B and the second electrode layer 102C in this order, is deposited on the entirety of an upper surface of the substrate 101.

(Second Manufacturing Step)

Figure 2:
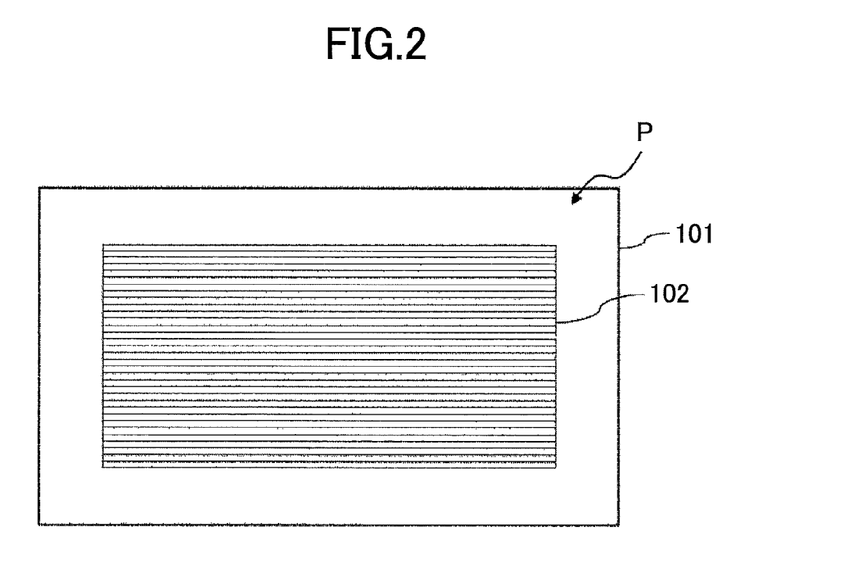
FIG. 2 is a plan view illustrating a peripheral removed area formed on a substrate by the method of manufacturing the thin-film photovoltaic module of the embodiment.

The photoelectric conversion element 102 is removed from a peripheral portion of the substrate 101, on the entirety of which the photoelectric conversion element 102 is deposited, to form a peripheral removed area P (see FIG. 2).

(Third Manufacturing Step)

The cover glass 12 is laminated by the filling material 11 and the peripheral portion is sealed by the sealant 13.

Here, the peripheral removed area P formed in the second manufacturing step is a space provided for ensuring a distance through insulation and a dielectric strength of the thin-film photovoltaic module 1. The peripheral removed area P is formed by removing a portion of the photoelectric conversion element 102 that is formed on the entirety of the substrate 101 with a predetermined width from an edge of the substrate 101 toward inside. In this embodiment, in which the rectangular (quadrangle) shaped substrate 101 is used, the peripheral removed area P is formed to be a rectangular shaped frame along a peripheral shape of the substrate 101.

The peripheral removed area P includes peripheral removed areas P1 and P2 that are formed by the following two removing steps.

(First Removing Step)

Figure 3:
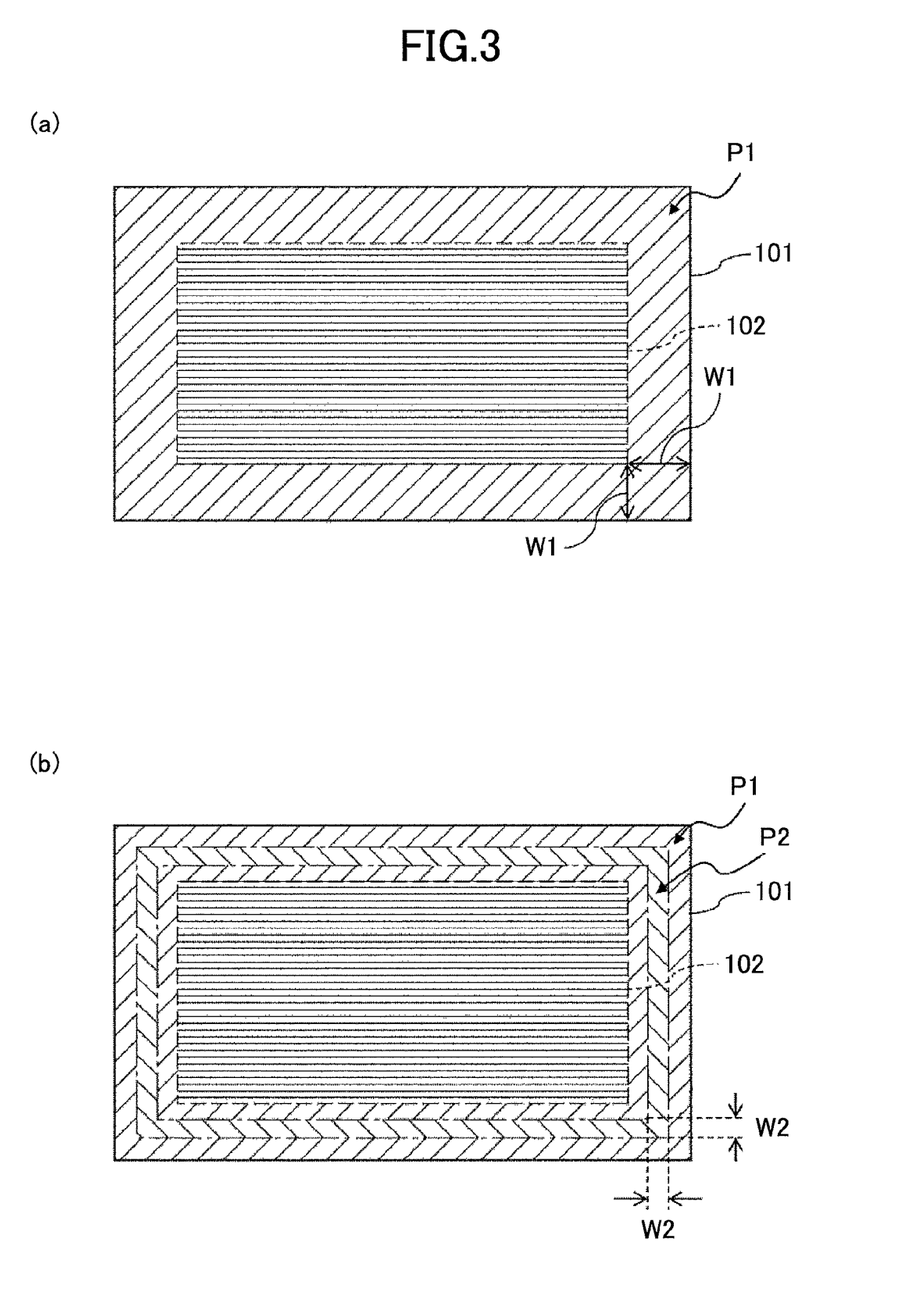

The photoelectric conversion element 102 deposited at a frame-like area from a side of the substrate 101 toward inside with a removal width W1 is evenly removed among the photoelectric conversion element 102 that is formed on the entirety of the substrate 101 to form a frame-like peripheral removed area P1 at which the photoelectric conversion element 102 is removed (see FIG. 3A).

(Second Removing Step)

Subsequent to the first removing step, the photoelectric conversion element 102 that is not removed in the first removing step is removed at a frame-like area with a removal width W2, which is narrower than the removal width W1, within the peripheral removed area P1 to which the process of the first removing step is performed to form a frame-like peripheral removed area P2 at which the photoelectric conversion element 102 that is not removed in the first removing step is removed (see FIG. 3B).

Here, as the removal width W1 in the first removing step is a distance that corresponds to the distance through insulation of a standard, it is required for the removal width W1 to be longer than or equal to a distance equivalent to a predetermined distance through insulation. Specifically, for example, in a module of the embodiment in which a system voltage is 1000 V and an applied class is "A", the minimum distance through insulation of a standard such as IEC: 61730 or JIS: C8992 is 8.4 mm. However, actually, in order for clearance and ensuring the dielectric strength, it is designed to be greater than or equal to 10 mm. Further, as the removal width W2 in the second removing step is a distance that determines a final dielectric strength, it is required for the removal width W2 to have a sufficient length to provide a predetermined dielectric strength. Specific values will be explained later based on evaluation tests, which will be described later.

(First Embodiment)

The removing steps 1 and 2 that are performed in the method of manufacturing the thin-film photovoltaic module of the first embodiment is explained in detail in the following. In this embodiment, laser is used for removing the photoelectric conversion element 102 in both the first and second removing steps. Further in detail, a pulsed laser of infrared region at a wavelength 1.06 μm with the diameter of a laser beam is about 100 μm is used. Further, the energy density of the irradiating laser beam is 1 W/cm$^2$ to 10 W/cm$^2$.

Figure 4:
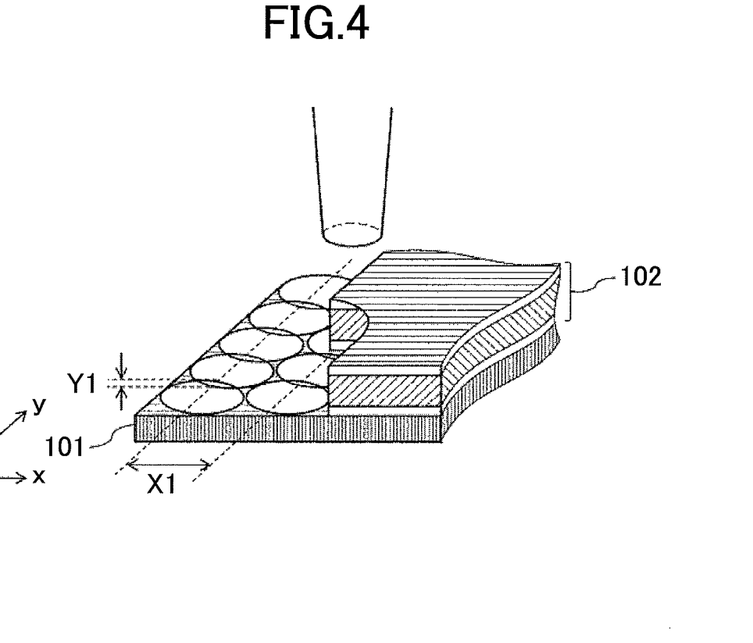
FIG. 4 is a partially enlarged schematic view illustrating scanning of a laser beam, in the method of manufacturing the thin-film photovoltaic module of the embodiment.

In the first removing step, the following process is performed for each side edge portion of four side edge portions of the rectangular shaped frame-like peripheral removed area P1 to remove the photoelectric conversion element 102 on the substrate 101. This means that, as illustrated in FIG. 4, when removing the one side edge portion of the photoelectric conversion element 102, the laser beam is scanned along a side of the substrate 101 with a predetermined overlapping amount Y1 or an overlapping ratio (hereinafter, a direction along the side of the substrate 101 is referred to as a "y direction" and a direction perpendicular to the side of the substrate 101 is referred to as an "x direction"). After the laser beam is irradiated from one end to the other end of the substrate 101 along the y direction, the laser beam is moved in the x direction for a predetermined moving amount X1, and then, the laser beam is irradiated from the one end to the other end of the substrate 101 in the y direction again with the same overlapping amount Y1.

Here, the overlapping amount Y1 of the laser beam in the y direction is set to be at least smaller than the beam diameter. Further, it is preferable that the moving amount X1 in the x direction perpendicular to the y direction is at least smaller than or equal to the beam diameter.

As such, the process of moving the laser in the x direction for the moving amount X1 every time the photoelectric conversion element 102 is removed by irradiating the laser beam from the one end to the other end of the substrate 101 along the y direction, and irradiating the laser beam from the one end to the other end of the substrate 101 again to remove the photoelectric conversion element 102, is repeated from the side of the substrate 101 toward inside with the removal width W1. With this, the photoelectric conversion element 102 is removed at an area having a substantially strip shape as a whole at the one side edge portion of the substrate 101. The method of irradiating the laser beam may be other than the above described method and the laser beam may be scanned in the x direction first and then may be moved in the y direction. Further, the laser beam may be scanned in both directions in the y direction (plus and minus directions of the y direction), not only in a single direction (plus direction of the y direction, for example).

The first removing step is finished when the peripheral removed area P1 is formed at which the frame-like photoelectric conversion element 102 is removed by performing the same process for all of the four side edge portions of the substrate 101 to remove the photoelectric conversion element 102 deposited on the substrate 101 along the sides of the substrate 101 of the rectangular shaped frame.

Figure 5:
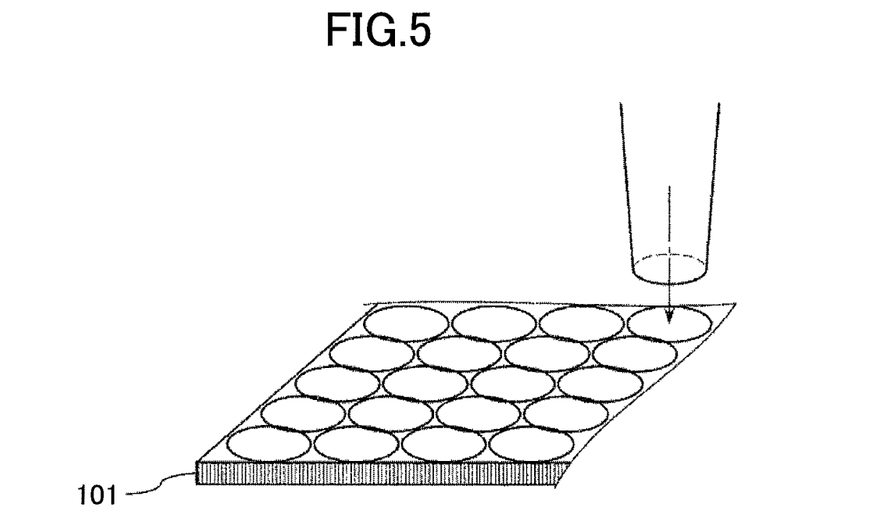
FIG. 5 is a schematic view illustrating irradiation spots of the laser beam in the first removing step, in the method of manufacturing the thin-film photovoltaic module of the embodiment.

Here, as illustrated in FIG. 5, the photoelectric conversion element 102 is remained as residue at portions where the circular laser beam is not irradiated, in the peripheral removed area P1 on which the process of the first removing step is performed. Further, even within a range where the laser beam is irradiated, residue may be remained at portions where the exposure energy of the laser beam is insufficient or where dirt is adhered at an irradiation surface of the laser beam.

Thus, the second removing step in which the residue is removed, that is performed subsequent to the first removing step and that is necessary in order to ensure a predetermined dielectric strength, is performed on the frame-like peripheral removed area P2 with the removal width W2, which is narrower than the removal width W1. The peripheral removed area P2 is inside the peripheral removed area P1 on which the process of the first removing step is performed.

In the second removing step, similar to the first removing step in which the photoelectric conversion element 102 is removed for each of the four side edge portions of the peripheral removed area P1, the following process is performed for each side of four sides of the peripheral removed area P2 to remove the photoelectric conversion element 102 that is not removed in the first removing step. This means that, similar to the first removing step, the laser beam is irradiated while scanning the laser beam in the y direction with the predetermined overlapping amount Y1 or the overlapping ratio. After the laser beam is irradiated from one end to another end of the side along the y direction, the laser beam is moved in the x direction for the predetermined moving amount X1, and then, the laser beam is irradiated from the one end to the other end of the side in the y direction again with the same overlapping amount Y1. Here, similar to the first removing step, the method of irradiating the laser beam may be other than the above described method and the laser beam may be scanned in the x direction first and then may be moved in the y direction. Further, the laser beam may be scanned in both directions in the y direction (plus and minus directions of the y direction), not only in a single direction (plus direction of the y direction, for example).

Figure 6:
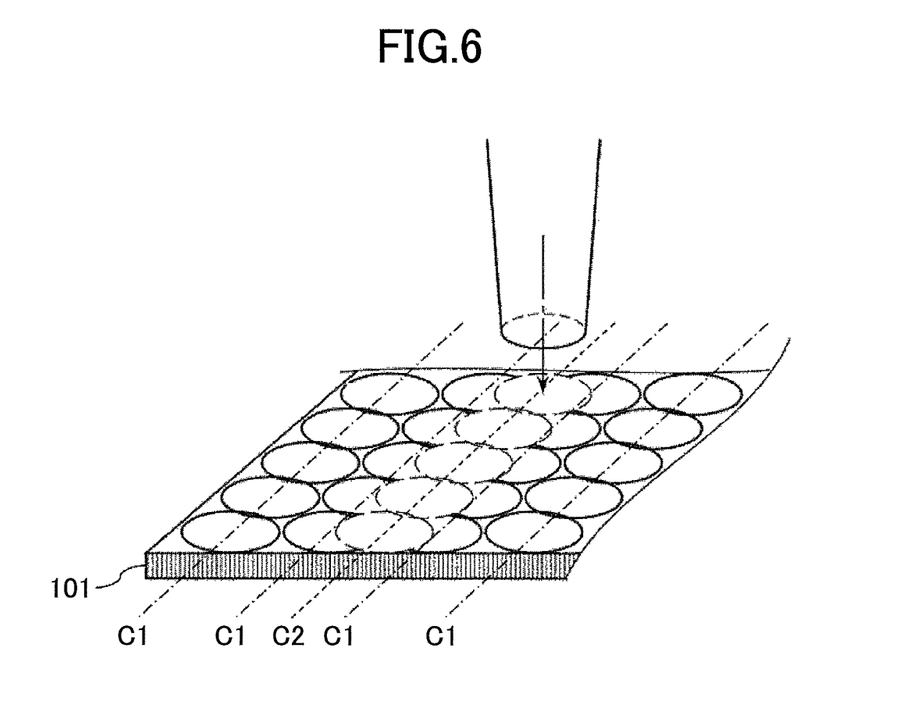
FIG. 6 is a schematic view illustrating irradiation spots of the laser beam in the second removing step, in the method of manufacturing the thin-film photovoltaic module of the embodiment.

Here, as illustrated in FIG. 6, when scanning the laser beam in the y direction, the laser beam is scanned such that a center line (a virtual line that connects centers of irradiation spots of the laser beam) C2 of a scanning path of the laser beam scanned in the y direction is not superimposed or matched with a center line C1 of a scanning path of the laser beam scanned in the y direction in the first removing step. Circles drawn by a solid line on the substrate in FIG. 6 indicate irradiation spots (removal trace) of the laser beam in the first removing step, and circles drawn by a dashed line indicate irradiation spots of the laser beam in the second removing step.

Figure 7:
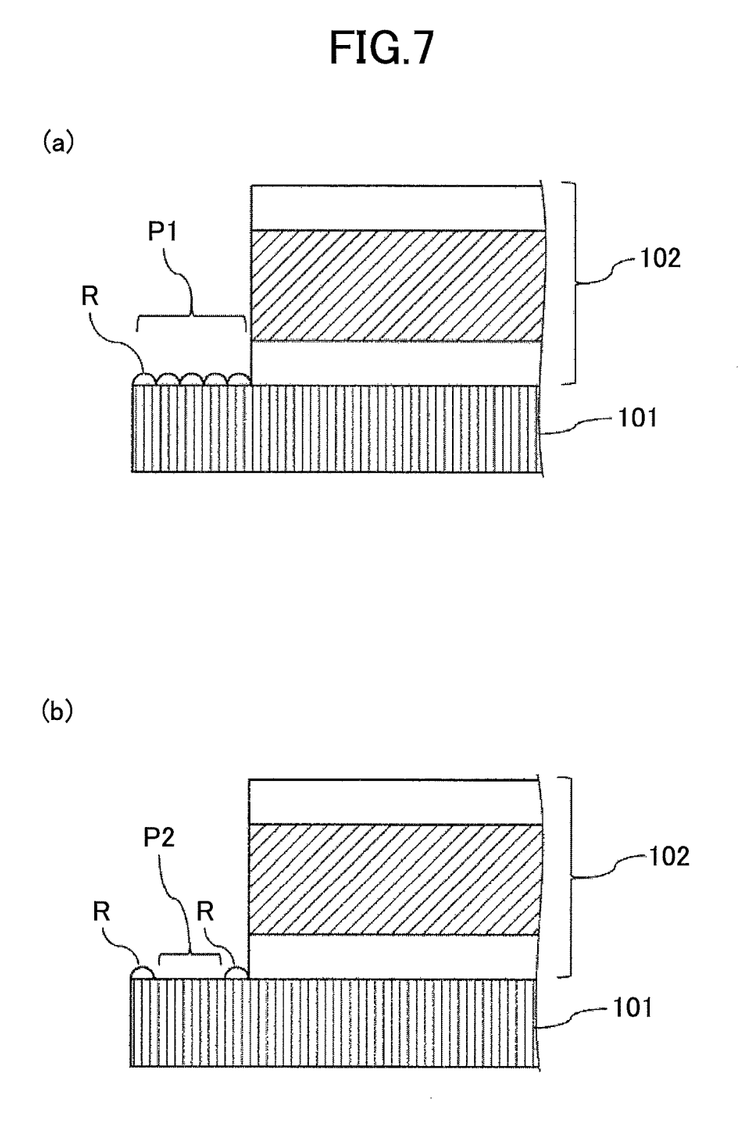

As such, as illustrated in FIG. 7-(a) and FIG. 7-(b), by shifting the center line C1 of the scanning path of the laser beam in the first removing step and the center line C2 of the scanning path of the laser beam in the second removing step, the residue R that is not removed in the first removing step in the peripheral removed area P2 is finely removed. In particular, the laser beam is irradiated at portions to which the laser beam is not irradiated in the first removing step so that the residue can be more securely removed. Thus, after the similar process is performed for all of the four sides of the peripheral removed area P2, the frame-like peripheral removed area P2 at which the residue of the first removing step is removed is formed and the second removing step is completed. By the first and second removing steps, the peripheral removed area P capable of ensuring the dielectric strength and the distance through insulation necessary for the thin-film photovoltaic module 1 can be formed.

Figure 8:
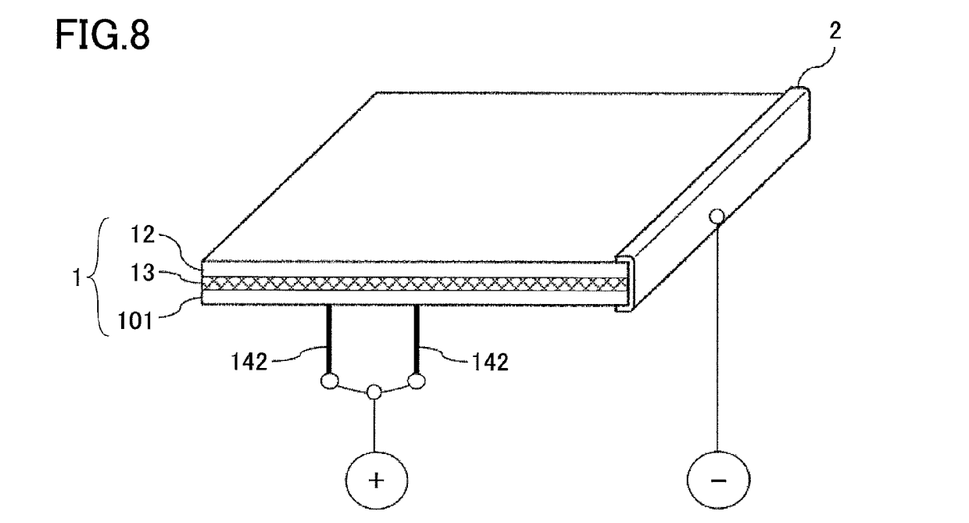
FIG. 8 is a circuit diagram schematically illustrating a circuit for evaluating the thin-film photovoltaic module manufactured by the method of manufacturing the thin-film photovoltaic module of the embodiment.

In order to confirm the effect of the invention, insulation tests (a dielectric withstand test and a dielectric resistance measurement) of the photovoltaic module 1 using the circuit board 10 provided with the peripheral removed area P was performed. Samples including four kinds of circuit boards 10 in which the removal width W2 of the second removing step was 0.8 mm, 1.4 mm, 2.0 mm and 3.0 mm, 1 to 2 for each, were prepared and each of them was made into a photovoltaic module. As illustrated in FIG. 8, in each of the modules, connecting wirings 142 drawn from the first electrode layer 102A and the second electrode layer 102C of the photoelectric conversion element 102 via bus wirings 141, respectively, were connected to form a positive terminal (for the bus wirings 141 and the connecting wirings 142, see Embodiment 4). Further, a copper film was attached to cover a side of the module to form a negative terminal.

Thereafter, the positive terminal and the negative terminal of each of the modules were connected to a positive terminal and a negative terminal of an insulation test apparatus, respectively, and the dielectric withstand test was conducted by applying a voltage of a direct current 3000 V. Thereafter, the dielectric resistance measurement was conducted by applying a voltage of direct current 500 V. The above steps were performed for each of the sides of each of the modules. As such, although each side of the module is treated as one measurement point in this insulation test, conditions other than that are similar to measurement conditions defined by IEC: 61646 or JIS: C8991.

The result of the dielectric withstand test is illustrated in Table 1. The dielectric withstand test is for confirming whether dielectric breakdown occurs or not. If the leak current was less than or equal to a standard leak current 50 μA, it was determined that dielectric breakdown did not occur, and the removal width for which the dielectric breakdown did not occur at all of the measurement points was determined to pass the test. In Table 1, for "all measurement points" and "passed points", each of the sides of each of the prepared modules was counted as one point. Further, for the dielectric resistance measurement, all the measurement points cleared (passed), greater than or equal to a standard value of 50 MΩ.

TABLE 1

| SECOND REMOVAL WIDTH W2 | ALL MEASUREMENT POINTS | NUMBER OF PASSED POINTS | PASS-FAIL |
|---|---|---|---|
| 0.8 mm | 8 | 2 | FAIL |
| 1.4 mm | 8 | 7 | FAIL |
| 2.0 mm | 4 | 4 | PASS |
| 3.0 mm | 4 | 4 | PASS |

DIELECTRIC WITHSTAND TEST 3000 VDC 1 MINUTE
PASS CONDITION <50 μA

As described above, for the samples each of whose removal width W2 is less than or equal to 1.4 mm, there is a case that the dielectric breakdown occurs and the sample cannot pass the dielectric withstand test. However, for the samples each of whose removal width W2 is greater than or equal to 2.0 mm, all of the samples passed the dielectric withstand test. Further, for the dielectric resistance measurement, all of the samples cleared the standard value. With the above result, it was confirmed that is it possible to improve the dielectric strength by performing the second removing step, and under the conditions of the example, that the dielectric strength can be ensured when the removal width W2 of the second removing step is greater than or equal to 2.0 mm.

Further, an increased amount of a tact time in accordance with performing the second removing step in addition to the first removing step was almost equal to a ratio of the removal width W2 of the second removing step with respect to the removal width W1 of the first removing step. This means that when performing the first removing step for the width 10.0 mm and further performing the second removing step for the width 2.0 mm, the increased amount of the tact time is 20%. This increased amount is sufficiently within an allowable range in actual steps. As described above, it is confirmed that the dielectric strength can be ensured by performing the second removing step and that the increased amount of the tact time in accordance with that is within an allowable range, in other words, the effect of the embodiment was confirmed.

(Second Embodiment)

Figure 9:
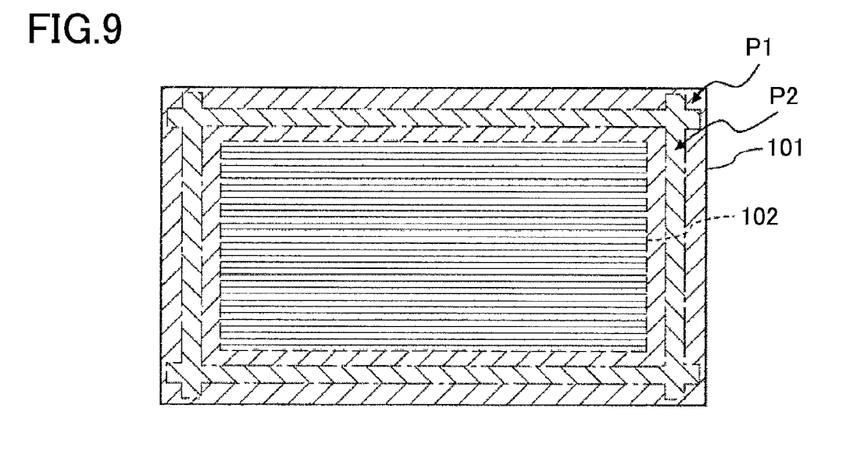
FIG. 9 is a plan view illustrating the peripheral removed area formed by the method of manufacturing the thin-film photovoltaic module of a second embodiment.

In the above described first embodiment, the peripheral removed area P2 is formed to be a rectangular shaped frame along the peripheral shape of the substrate 101. In the second embodiment, as illustrated in FIG. 9, the peripheral removed area P2 may have a lattice shape. Here, the first removing step of the embodiment is performed as the same as the above described first embodiment.

In this embodiment as well, in the second removing step, the residue in the peripheral removed area P2 is removed by scanning the laser beam for each of four sides of the lattice shaped peripheral removed area P2 to be irradiated on the substrate 101.

According to the above described first embodiment, the peripheral removed area P2 has a frame-like rectangular shape. Thus, it is difficult to control the laser in order to accurately remove the residue by the laser beam at end portions of each of the sides or at each vertex when removing the residue for each of the sides of the rectangular shape. On the other hand, according to the present embodiment, as each of the sides of the lattice shape crosses with the adjacent side, it is easy to control the laser at each corner portion of the lattice shape at which the adjacent sides cross with each other. As a result, the dielectric strength and the distance through insulation necessary for the thin-film photovoltaic module 1 can be securely provided.

(Third Embodiment)

In the above described second removing step of the first or second embodiment, the photoelectric conversion element 102 on the substrate 101 as the residue is removed by the laser beam at the peripheral removed area P2. In the third embodiment, the photoelectric conversion element 102 on the substrate 101 as the residue is removed with an upper surface portion of the substrate 101 on which the photoelectric conversion element 102 as the residue is deposited. Here, the first removing step of the embodiment is performed as the same as the above described first embodiment.

Figure 10:
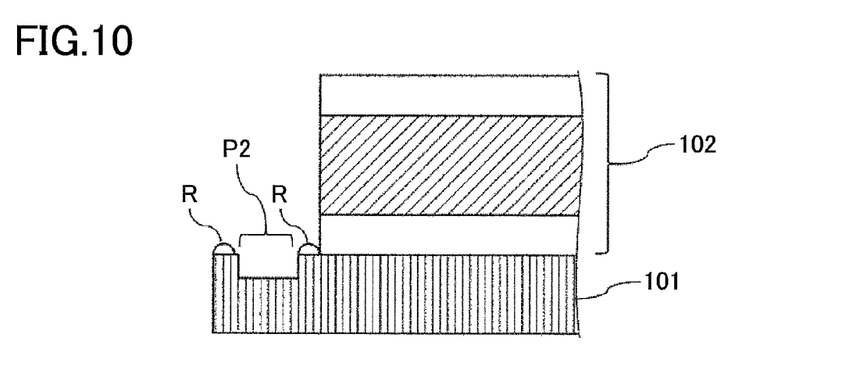
FIG. 10 is a cross-sectional view illustrating the thin-film photovoltaic module manufactured by the method of manufacturing the thin-film photovoltaic module of a third embodiment.

FIG. 10 schematically illustrates the state of the thin-film photovoltaic module 1 after the second removing step of the embodiment is performed. By increasing the energy density of the laser beam in the second removing step, as illustrated in FIG. 10, an upper surface of the substrate 101 is also removed with the residue generated in the first removing step at the peripheral removed area P2 on which the laser beam is irradiated.

By removing the residue with the upper surface portion of the substrate 101, the surface on which the laser beam is irradiated can be securely made into a clean surface, and can securely have a necessary dielectric strength.

(Fourth Embodiment)

Figure 11:
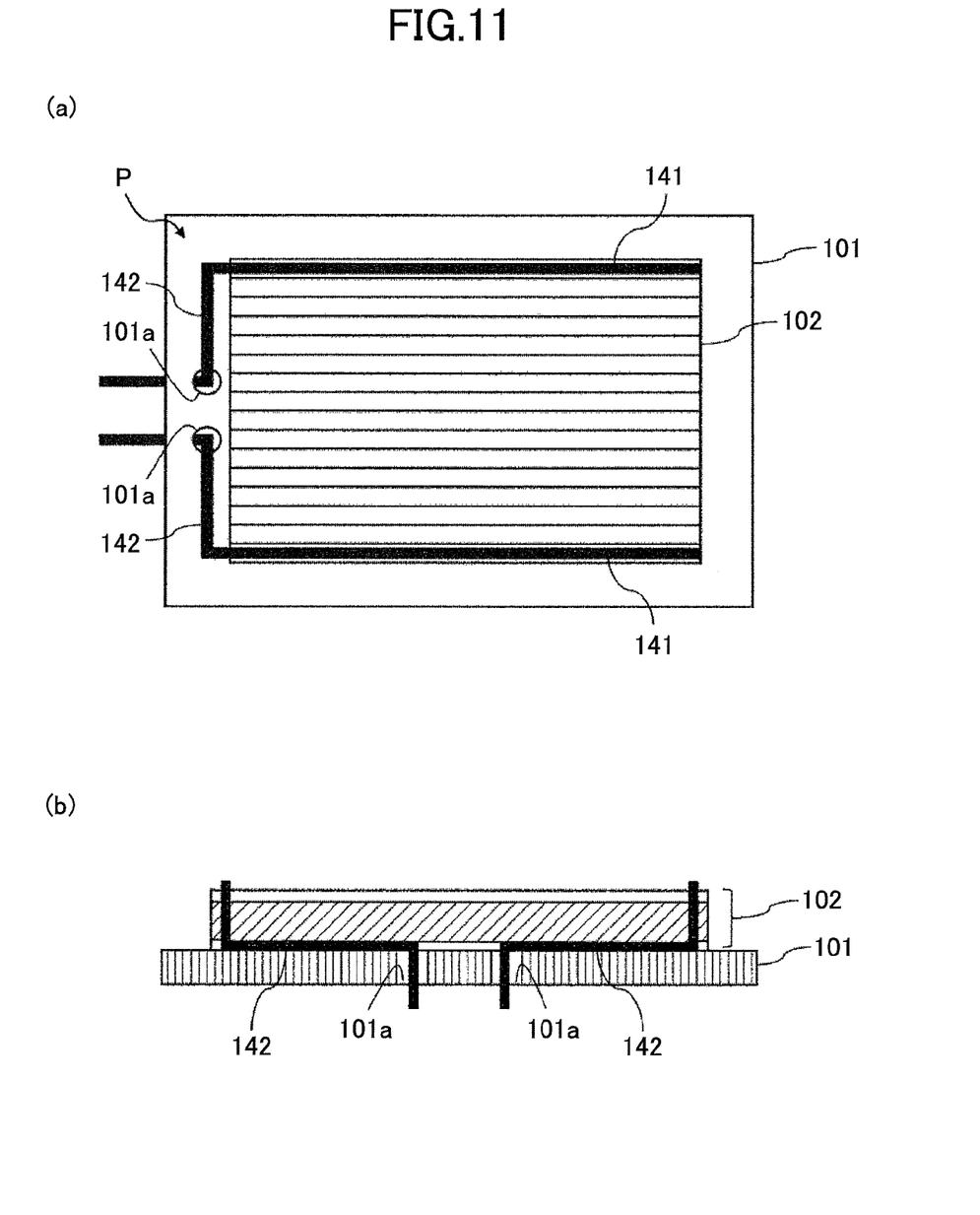

In the above described first to third embodiments, in order to ensure a predetermined dielectric strength, the second removing step with the removal width W2 is performed. In this embodiment, connecting wirings for outputting current generated in the photoelectric conversion element 102 are added. Thus, in this embodiment, due to the reason as will be explained in the following, the second removing step with a removal width W3 is performed. In other words, although it is not described in the first to third embodiments, as illustrated in FIG. 11-(*a*) and FIG. 11-(*b*), in the actual thin-film photovoltaic module 1, the bus wirings 141 are attached to the first electrode layer 102A and the second electrode layer 102C for outputting the current generated by the photoelectric conversion. Further, the connecting wirings 142 connected to the bus wirings 141, respectively, are extended outside via the peripheral removed area P of the substrate 101 and through holes 101*a* provided on the substrate 101.

Here, for the connecting wiring 142, a wiring prepared by plating a ribbon wire made of a copper film by cerasolzer (registered trademark), which is a kind of ceramic solder, may be used, for example. However, there is a case that the color of the plating changes to a rust-color or the like when the photoelectric conversion element 102, which is the residue, contacts the plating. Thus, by performing the second removing step with the removal width W3 that is a width capable of ensuring the predetermined dielectric strength and more than or equal to a width of the connecting wiring 142, and providing the connecting wiring 142 at the portion, the change of the color of the plating due to a contacting of the connecting wiring 142 with the photoelectric conversion element 102 can be prevented.

Figure 12:
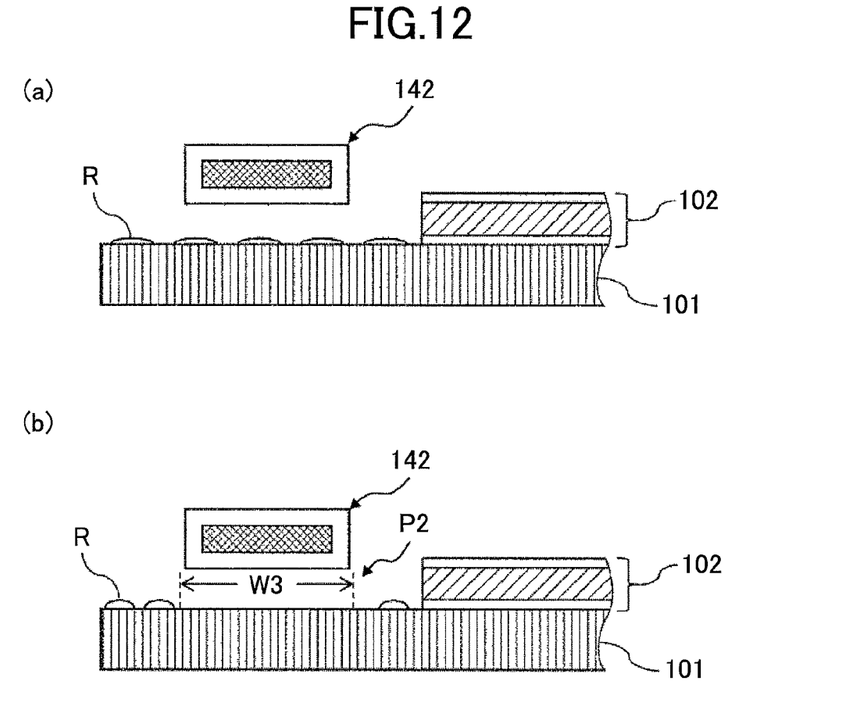

In this embodiment as well, the first removing step is performed similarly to the above described first to third embodiments. FIG. 12-(*a*) illustrates a state of the substrate 101 in which the first removing step is performed. As described above, at the time when the first removing step is just completed, the photoelectric conversion element 102 as the residue R is adhered on the substrate 101. Thus, as illustrated in FIG. 12-(*b*), the second removing step is performed with the removal width W3 that is a width capable of ensuring the predetermined dielectric strength, and greater than or equal to the width of the connecting wiring 142, and the connecting wirings 142 are provided on the peripheral removed area P2 formed by the second removing step.

By performing the second removing step for the above described removal width W3, it is possible to provide the connecting wirings 142 on the clean surface at which the residue of the photoelectric conversion element 102 does not exist. Thus, as a result, the change of the color of the plating of the connecting wirings 142 can be prevented and good appearance can be maintained.

(Fifth Embodiment)

Figure 13:
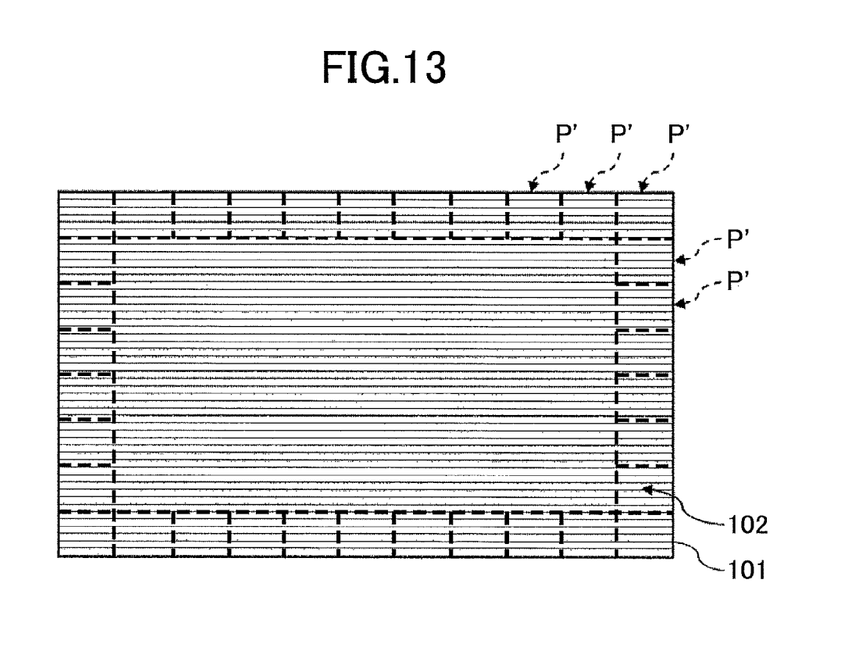
FIG. 13 is a plan view illustrating a plurality of unit areas composing a peripheral removed area, in the method of manufacturing the thin-film photovoltaic module of a fifth embodiment.

In the above described first to fourth embodiments, the peripheral removed area P composed of the peripheral removed areas P1 and P2 is formed by removing the residue to form the peripheral removed area P2 in the second removing step after forming the peripheral removed area P1 by removing the frame-like photoelectric conversion element 102 on the substrate 101 in the first removing step. Meanwhile, according to the embodiment, as illustrated in FIG. 13, the frame-like peripheral removed area P, which is finally formed, is divided into a plurality of unit areas P' along sides of the substrate 101 with a constant length, and a third removing step corresponding to the first removing step and a fourth removing step corresponding to the second removing step are performed for each of the unit areas P'. The method of irradiating the laser beam may be other than the above described method and the laser beam may be scanned in the x direction first and then may be moved in the y direction. Further, the laser beam may be scanned in both directions in the y direction (plus and minus directions of the y direction), not only in a single direction (plus direction of the y direction, for example).

The third removing step corresponds to the above described first removing step. In the third removing step, same as explained above with reference to FIG. 4, the laser beam is scanned in the y direction along the side of the substrate 101 with the predetermined overlapping amount Y1 or the overlapping ratio at the unit area P' defined by a constant length and the removal width W1 from the side of the substrate 101. After the laser beam is irradiated from the one end to the other end of the unit area P' along the y direction, the laser beam is moved in the x direction, perpendicular to the y direction, for the predetermined moving amount X1, and then, the laser beam is irradiated from the one end to the other end of the unit area P' in the y direction with the same overlapping amount Y1.

Further, the fourth removing step corresponds to the above described second removing step. In the fourth removing step, the photoelectric conversion element 102 as the residue that is not removed in the third removing step is removed along the side of the substrate 101 at the unit area P' to which the third removing step is performed with the removal width W2 narrower than the removal width W1. When removing, same as the third removing step, the laser beam is scanned along the y direction with the predetermined overlapping amount Y1 or the overlapping ratio. After the laser beam is irradiated from the one end to the other end of the unit area P' in the y direction, the laser beam is moved in the x direction for the predetermined moving amount X1, and then, the laser beam is irradiated from the one end to the other end of the unit area P' again in the y direction with the same overlapping amount Y1. Further, similar to the third removing step, the method of irradiating the laser beam may be other than the above described method and the laser beam may be scanned in the x direction first and then may be moved in the y direction. Further, the laser beam may be scanned in both directions in the y direction (plus and minus directions of the y direction), not only in a single direction (plus direction of the y direction, for example).

Figure 14:
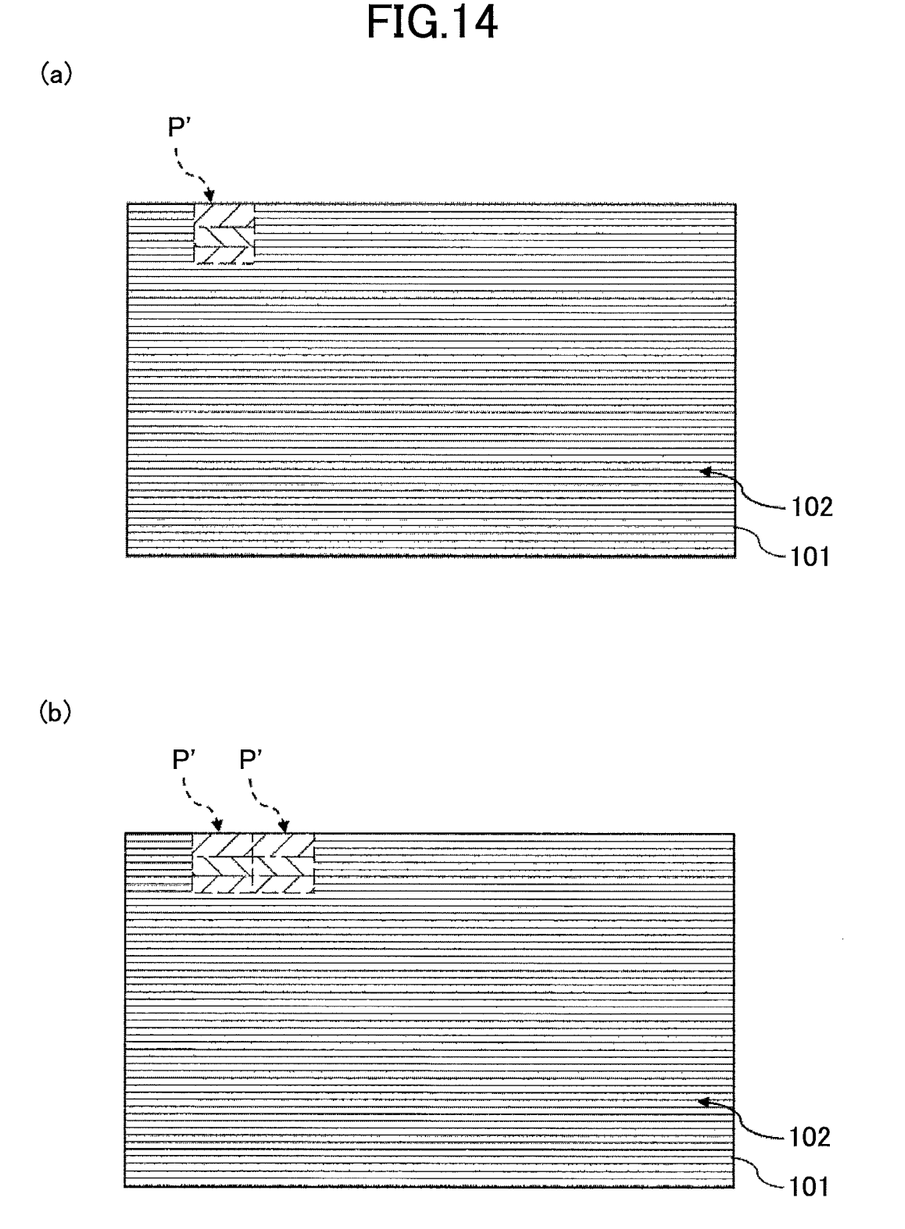

As illustrated in FIG. 14-(a), when the third and fourth removing steps are performed on a single unit area P', subsequently, as illustrated in FIG. 14-(b), the third and fourth removing steps are performed on a next single unit area P'. After the third and fourth removing steps are performed on all of the unit areas P', finally, similar to the first embodiment, the frame-like peripheral removed area P is formed.

According to the embodiment, compared with the case in which the entirety of the frame-like peripheral removed area P1 or the peripheral removed area P2 are formed in the first removing step and the second removing step, the photoelectric conversion element 102 may be removed for each of the unit areas P'. Thus, as the photoelectric conversion element 102 can be removed by a laser processing apparatus or the like that targets a relatively narrow unit area P' as a processing area, without using a large laser processing apparatus or the like that targets the entirety of the substrate 101 as a processing area, burden for preparing a facility can be reduced, particularly, in manufacturing a large thin-film photovoltaic module.

Here, in the above embodiments, the overlapping amount of the laser beam in the scanning direction of the laser processing apparatus is set to be the same in both the first and second removing steps (same for the third and fourth removing steps), the overlapping amount of the laser beam in the first and second removing steps may be set differently. With this configuration, the laser beam can be easily irradiated at portions where the laser beam is not irradiated in the first removing step. Thus, the peripheral removed area P can be further made into a clean surface. In particular, by scanning the laser processing apparatus with an overlapping amount in the second removing step larger than the overlapping amount Y1 of the laser beam in the scanning direction of the laser processing apparatus in the first removing step, as it is possible not to increase the processing time in the first removing step in which the peripheral removed area P1 is a processing area that is larger than a processing area in the second removing step, increase of the tact time can be suppressed.

Further, in the above embodiments, although the beam diameter of the laser beam is set to be the same in both the first and second removing steps (same for the third and fourth removing steps), the beam diameter in the first and second removing steps may be set differently by adjusting the aperture diameter of the laser processing apparatus. With this configuration as well, the laser beam can be easily irradiated at portions where the laser beam is not irradiated in the first removing step. Thus, the peripheral removed area P can be further made into a clean surface.

Further, in the above embodiments, in the second removing step (same for the fourth removing step), the laser beam is moved in the x direction for the moving amount X1. However, if the removal width W2 is covered without moving the laser beam in the x direction, it is unnecessary to move the laser beam in the x direction.

Further, although an example in which the laser beam is used in removing the photoelectric conversion element 102 on the substrate 101 is explained in the above embodiments, this is not limited so. Sandblasting using an abrasive material or a method by a belt sander may be used.

NUMERALS 1 thin-film photovoltaic module
10 circuit board
101 substrate
101a through hole
102 photoelectric conversion element
102A first electrode layer
102B thin-film photoelectric conversion layer
102C second electrode layer
11 filling material
12 cover glass
13 sealant
141 bus wiring
142 connecting wiring
2 electrode
P peripheral removed area
P1 peripheral removed area
P2 peripheral removed area
P' unit area
W1 removal width
W2 removal width
W3 removal width
Y1 overlapping amount
X1 moving amount
C1 center line
C2 center line
R residue

What is claimed is:

1. A method of manufacturing a thin-film photovoltaic module in which a photoelectric conversion element is deposited on a substrate and insulation properties of a peripheral portion of the substrate is ensured, the photoelectric conversion element including a first electrode layer, a thin-film photoelectric conversion layer and a second electrode layer stacked in this order, the method comprising removing the photoelectric conversion element deposited on the entirety of the substrate at a frame shape area from sides of the substrate toward inside with a predetermined width by performing for each of the sides of the substrate, a first removing step of scanning a first photoelectric conversion element removing device along the respective side of the substrate for a plurality of times while shifting the first photoelectric conversion element removing device in a direction that is perpendicular to the respective side every time the first photoelectric conversion element removing device scans along the respective side of the substrate, at the area from the respective side of the substrate toward inside with the predetermined width along the respective side of the substrate to remove the photoelectric conversion element deposited on the substrate for the predetermined width, and a second removing step of scanning a second photoelectric conversion element removing device, within the area at which the photoelectric conversion element is removed in the first removing step, along the respective side of the substrate to remove the photoelectric conversion element that is not removed in the first removing step at a width narrower than the predetermined width such that a center line of a scanning path of the second photoelectric conversion element removing device is positioned between two adjacent center lines of two adjacent scanning paths of the first photoelectric conversion element removing device in the first removing step.

2. The method of manufacturing a thin-film photovoltaic module according to claim 1,
wherein, for each of the sides of the substrate, the area from the respective side of the substrate toward inside with the predetermined width is divided into a plurality of unit areas by a constant length along the respective side of the substrate, and
wherein the first removing step and the second removing step are performed for each of the unit areas so that the photoelectric conversion element of a frame shape is removed by performing the first removing step and the second removing step for all of the plurality of unit areas.

3. The method of manufacturing a thin-film photovoltaic module according to claim 1,
wherein, for each of the sides of the substrate, in the first removing step, the first photoelectric conversion element removing device is scanned along the respective side of the substrate from one end to the another end of the substrate to remove the photoelectric conversion element deposited at the one end to the other end of the substrate, and the first photoelectric conversion element removing device is moved in a direction perpendicular to the respective side of the substrate every time the photoelectric conversion element is removed from the one end to the other end of the substrate, to remove the photoelectric conversion element from the respective side of the substrate for the predetermined width.

4. The method of manufacturing a thin-film photovoltaic module according to claim 1,
wherein the second photoelectric conversion element removing device in the second removing step is a laser processing apparatus that irradiates a laser beam and the photoelectric conversion element is removed by the laser beam.

5. The method of manufacturing a thin-film photovoltaic module according to claim 4,
wherein the first photoelectric conversion element removing device in the first removing step is a laser processing apparatus that irradiates a laser beam and the photoelectric conversion element is removed by the laser beam.

6. The method of manufacturing a thin-film photovoltaic module according to claim 5,
wherein an overlapping amount of the laser beam in a scanning direction of the first photoelectric conversion element removing device of the first removing step and an overlapping amount of the laser beam in a scanning direction of the second photoelectric conversion element removing device of the second removing step are different from each other.

7. The method of manufacturing a thin-film photovoltaic module according to claim 6,
wherein the overlapping amount of the laser beam in the scanning direction of the second photoelectric conversion element removing device of the second removing step is larger than the overlapping amount of the laser beam in the scanning direction of the first photoelectric conversion element removing device of the first removing step.

8. The method of manufacturing a thin-film photovoltaic module according to claim 1,
wherein in the second removing step, for each of the sides of the substrate, the second photoelectric conversion element removing device is scanned at a center portion in the direction that is perpendicular to the respective side within the area at which the photoelectric conversion element is removed in the first removing step from one end to the another end of the substrate along the respective side, and
wherein an area at which the photoelectric conversion element is removed has a lattice shape in which each of the sides configuring a frame shape protrudes beyond the frame shape.

9. The method of manufacturing a thin-film photovoltaic module according to claim 1,
wherein in the second removing step, the photoelectric conversion element is removed with an upper surface portion of the substrate on which the photoelectric conversion element is deposited by the second photoelectric conversion element removing device.

10. The method of manufacturing a thin-film photovoltaic module according to claim 1,
wherein the width to which the second removing step is performed is at least larger than or equal to a width of each of wirings that are attached to the first electrode layer and second electrode layer, respectively, for extracting current by photoelectric conversion, and
wherein the wirings are provided at the area where the second removing step is performed on the substrate.

11. The method of manufacturing a thin-film photovoltaic module according to claim 9,
wherein the photoelectric conversion element is not removed with the upper surface portion of the substrate in the first removing step.

* * * * *